United States Patent
Shiomoto (10) Patent No.: US 6,807,207 B2
(45) Date of Patent: Oct. 19, 2004

(54) SEMICONDUCTOR LASER DEVICE

(75) Inventor: Takehiro Shiomoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 110 days.

(21) Appl. No.: 09/846,317

(22) Filed: May 2, 2001

(65) Prior Publication Data

US 2001/0026569 A1 Oct. 4, 2001

(51) Int. Cl.[7] .................................................. H01S 3/04
(52) U.S. Cl. ........................................ 372/36; 372/108
(58) Field of Search ............................ 372/43, 50, 39, 372/75, 41, 45, 46, 34, 36, 31, 108; 438/46, 20; 346/1.1; 307/238

(56) References Cited

U.S. PATENT DOCUMENTS

| | | | | |
|---|---|---|---|---|
| 4,092,614 A | * | 5/1978 | Sakuma et al. | 372/36 |
| 4,604,753 A | * | 8/1986 | Sawai | 372/36 |
| 4,901,325 A | * | 2/1990 | Kato et al. | 372/44 |
| 5,243,359 A | * | 9/1993 | Fisli | 346/1.1 |
| 5,402,436 A | * | 3/1995 | Paoli | 372/50 |
| 5,576,752 A | * | 11/1996 | Kovacs et al. | 347/238 |
| 5,636,234 A | * | 6/1997 | Takagi | 372/43 |
| 5,638,391 A | * | 6/1997 | Shima et al. | 372/44 |
| 5,723,881 A | * | 3/1998 | Chen | 257/88 |
| 5,790,577 A | * | 8/1998 | Kimura et al. | 372/43 |
| 5,802,088 A | * | 9/1998 | Otsuka et al. | 372/36 |
| 5,966,393 A | * | 10/1999 | Hide et al. | 372/23 |
| 6,240,113 B1 | * | 5/2001 | Peterson | 372/36 |
| 6,297,067 B1 | * | 10/2001 | Hattori | 438/20 |
| 6,301,278 B2 | * | 10/2001 | Uchida | 372/36 |
| 6,303,405 B1 | * | 10/2001 | Yoshida et al. | 438/46 |
| 6,347,103 B1 | * | 2/2002 | Song et al. | 372/36 |

FOREIGN PATENT DOCUMENTS

| | | |
|---|---|---|
| JP | 3-30388 | 2/1991 |
| JP | 3-145779 | 6/1991 |
| JP | 10-233550 | 9/1998 |
| JP | 11-97804 | 4/1999 |
| JP | 11-112091 | 4/1999 |
| JP | 2000-223791 | 8/2000 |
| JP | 2000-232255 | 8/2000 |
| WO | WO00/04614 | 1/2000 |

OTHER PUBLICATIONS

USSN 09/508,630 filed Mar. 14, 2000 Shiomoto et al.; "Semiconductor Laser Device".

* cited by examiner

*Primary Examiner*—Don Wong
*Assistant Examiner*—Tuan N. Nguyen
(74) *Attorney, Agent, or Firm*—Nixon & Vanderhye P.C.

(57) ABSTRACT

A semiconductor laser device has a stem having a mounting surface, a first semiconductor laser element directly or indirectly mounted onto the mounting surface of the stem, the first semiconductor laser element having an emission wavelength and a temperature dependence, and a second semiconductor laser element disposed on top of the first semiconductor laser element, the second semiconductor laser element having an emission wavelength different from the emission wavelength of the first semiconductor laser element and a temperature dependence lower than the temperature dependence of the first semiconductor laser element.

14 Claims, 6 Drawing Sheets

SEMICONDUCTOR LASER DEVICE

BACKGROUND OF THE INVENTION

The present invention generally relates to semiconductor laser devices. More particularly, the present invention relates to a semiconductor laser device that is preferably used as a component of an optical pickup for use in an apparatus for reading from and/or writing to a plurality of optical disks, and a method of manufacturing such semiconductor laser devices.

An optical pickup that emits light by utilizing a semiconductor laser is used as a light source for reading and/or writing of optical disks. Different kinds of optical disks require different optimum semiconductor laser wavelengths. The wavelengths optimum to the CD, the CD-R, and the DVD are a wavelength less than 800 nm, a wavelength in the neighborhood of 780 nm, and 650 nm, respectively.

Figure 1:
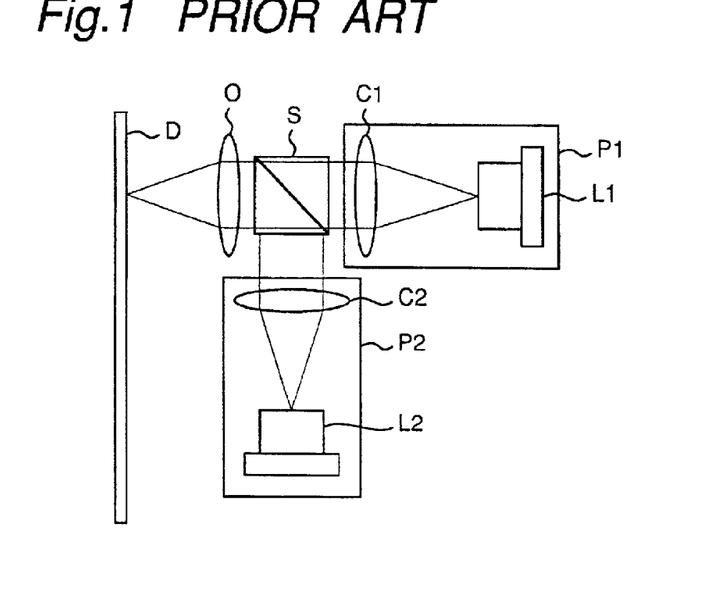
FIG. 1 is a schematic explanatory view showing an example of an apparatus for reading and/or writing data from and/or optical disks with a plurality of optical pickups.

Accordingly, an apparatus compatible with a plurality of kinds of optical disks such as the CD and the DVD is equipped with a plurality of different optical pickups, and switches between those pickups according to the type of a loaded disk. FIG. 1 shows an example of such an apparatus.

In the example shown in FIG. 1, there are two optical pickups P1, P2 that emit light having different wavelengths. One of these optical pickups is selected depending on the kind of an optical disk D loaded. The optical pickups P1, P2 include semiconductor lasers L1, L2 and collimator lens C1, C2 respectively. An optical system S including a half mirror is disposed between an objective lens O and each of the optical pickups P1, P2. The optical system S allows light emitted by both optical pickups P1, P2 to reach the optical disk D through the objective lens O. Light reflected by the optical disk D is read by an unshown photosensor provided in each of the optical pickups P1, P2.

In the example of FIG. 1, the two optical pickups P1, P2, which are separately disposed, occupies a large space. Further, because the lights emitted by respective optical pickups are required to reach the optical disk D, a complicated design of the optical system is required.

SUMMARY OF THE INVENTION

The present invention has been made to effectively solve the above problems of the conventional art. The present invention realizes production of an optical pickup capable of emitting lights having different wavelengths. The present invention provides a semiconductor laser device having the following characteristic features.

The semiconductor laser device of the present invention comprises a stem having a mounting surface, and first and second semiconductor laser elements directly or indirectly mounted onto the mounting surface of the stem, these two semiconductor laser elements having different emission wavelengths and different temperature dependences. The first semiconductor laser element that has a higher temperature dependence is located closer to the mounting surface of the stem. The second semiconductor laser element having lower temperature dependence is disposed on top of the first semiconductor laser element having higher temperature dependence. The first semiconductor laser element may be disposed on the stem directly or through an insulative submount, depending on a wiring condition or the like.

In the semiconductor laser device having the construction, lights having different wavelengths can be selectively emitted by the stacked first and second laser elements. Thus, an optical pickup using the semiconductor laser device emits two kinds of light beams selectively. Thus, an optical pickup that is made using the semiconductor laser device of the present invention is adaptable to two kinds of optical disks without increasing the size of an apparatus in which the optical pickup is included.

The reason why the first laser element having a higher temperature dependence is disposed closer to the mounting surface of the stem is as follows. Heat generated by the laser elements is released to the outside through the stem. This means that heat generated by the first laser element disposed closer to the mounting surface of the stem is easy to dissipate, while heat generated by the second laser element farther to the mounting surface of the stem is hard to dissipate. Accordingly, it is advisable to dispose a laser element less susceptible in an upper position far from the mounting surface of the stem. Conversely, a disadvantage would not occur if the laser element having a relatively high temperature dependence is disposed adjacently to the mounting surface of the stem.

In the present invention, light emitted by the first laser element having a higher temperature dependence may have an emission wavelength, for example, in the range of 640–660 nm, while light emitted by the second laser element having a lower temperature dependence may have an emission wavelength, for example, in the range of 770–800 nm. In this case, the semiconductor laser device is adaptable both to the DVD (by the provision of the laser element of 640–660 nm in wavelength) and to the CD or the CD-R (by the provision of the other laser element of 770–800 nm in wavelength).

In the semiconductor laser device of the present invention, the second semiconductor laser element which is disposed on the first semiconductor laser element may, preferably, be smaller in size than the first semiconductor laser element such that a part of a top surface of the first semiconductor laser element is exposed. This construction facilitates a wiring operation for a common electrode formed on an upper surface of the first laser element.

In the semiconductor laser device of the present invention, the first and second semiconductor laser elements may, preferably, have their P-layers or N-layers disposed adjacent to each other. By adopting the construction, it is possible to construct a common electrode between the two laser elements as an anode-common type or a cathode-common type, resulting in the simplification of a driving circuit.

In the semiconductor laser device of the present invention in which two laser elements are disposed one on top of the other, emission points of the two laser element may preferably be located at an interval as short as possible, in order to obtain preferable collimated light by making light emitted from each emission point incident on one collimator lens. More specifically, the interval between the two emission points may preferably be 160 micrometers or less.

As a means for realizing the above interval between the two emission points, it is conceivable to form each laser element to a height of 160 micrometers or less and locate the emission point at a center of the height of each laser element. Alternatively, it is possible to set the height of each laser element to 80 micrometers or less. In this case, because a total of the heights of both laser elements is 160 micrometers or less, the interval between both emission points necessarily becomes 160 micrometers or less, irrespective of the positions of the emission points.

In the present invention, it is possible to stack three or more laser chips one on another on or above the mounting surface of the stem, the three or more laser chips having different emission wavelengths and different temperature dependences. In this case, these semiconductor laser elements are stacked in order of temperature dependence such that the laser chip farther from the mounting surface of the stem has a lower temperature dependence than the laser chip closer to the mounting surface of the stem.

In fabricating the semiconductor laser device, it is necessary to join the laser elements to the stem or submount as well as to each other. The joint may be achieved by using conductive resins or soldering materials. When using soldering materials, it is preferable that soldering materials to be applied to different joined portions have different melting points, as described below. That is, a soldering material having a lower melting point is applied to a joined portion for which a joining operation is performed later. In other words, a soldering material having a highest melting point is used in an initial joining operation and a soldering material having a lower melting point is used in a later joining operation. In this way, it is possible to effectively prevent occurrence of a disadvantage that a soldering material at a previously joined portion melts in a subsequent joining operation.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS

Figure 2:
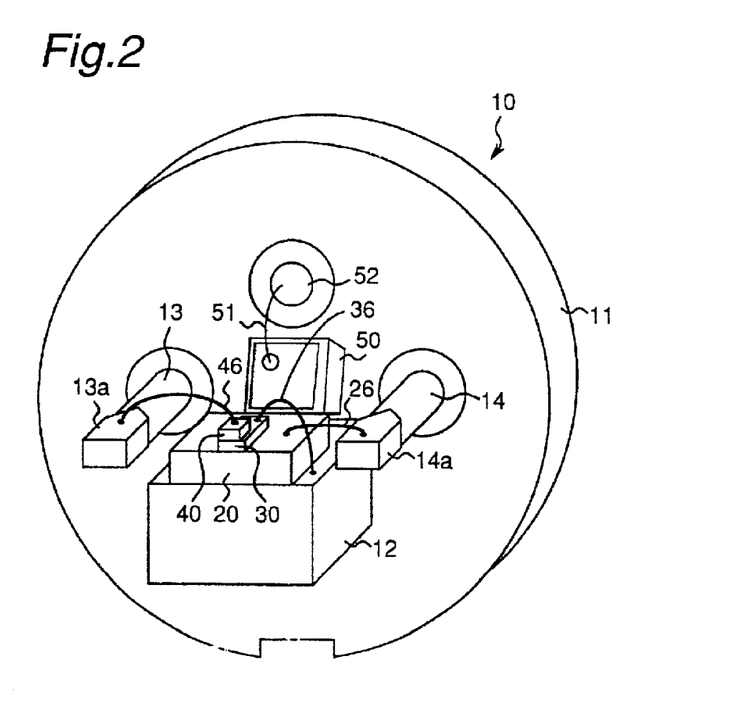
FIG. 2 is a perspective view for describing a semiconductor laser device according to an embodiment of the present invention.

An embodiment of the present invention will be described below with reference to the accompanied drawings. FIG. 2 is a perspective view showing a semiconductor laser device 10 according to an embodiment of the present invention. The semiconductor laser device 10 includes first and second semiconductor laser elements 30, 40 (details of which will be described) mounted to a metal stem. The first and second semiconductor laser elements 30, 40 are covered with a case to keep them hermetic or airtight. The semiconductor laser device 10 corresponds to a combination of the semiconductor lasers L1, L2 provided in the conventional optical pickups P1, P2 shown in FIG. 1. A laser beam emitted from a glass window formed on the case travels to an optical disk through an optical system including a collimator lens and other optical components.

As clearly shown in FIG. 2, the metal stem has a disk-shaped stem main body 11 and a rectangular supporting portion 12 integral with the stem main body 11 and projecting from the stem main body 11 at a location a little lower than the center of the stem main body. The main body 11 and the supporting portion 12 of the stem may be formed in two pieces instead of one piece. A photodiode 50 for receiving light reflected by an optical disk is disposed on the stem main body 11. A wire 51 extends from the photodiode 50 to a photodiode terminal 52.

Figure 3:
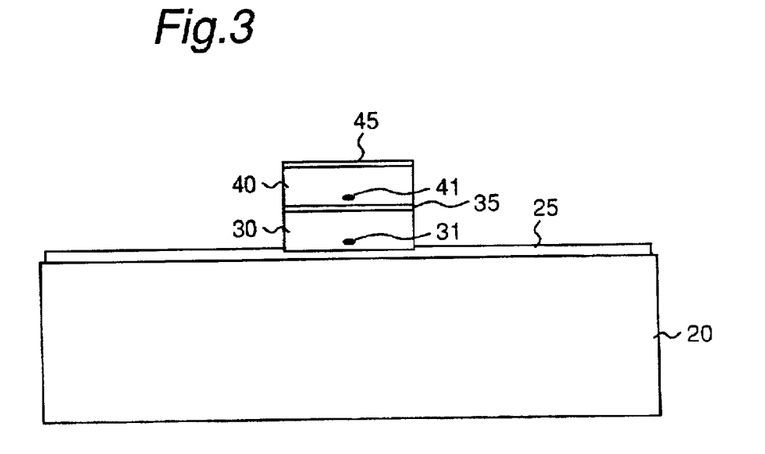
FIG. 3 is an enlarged front view of the semiconductor laser device shown in FIG. 2, showing two laser chips laid one on the other.
Figure 4:
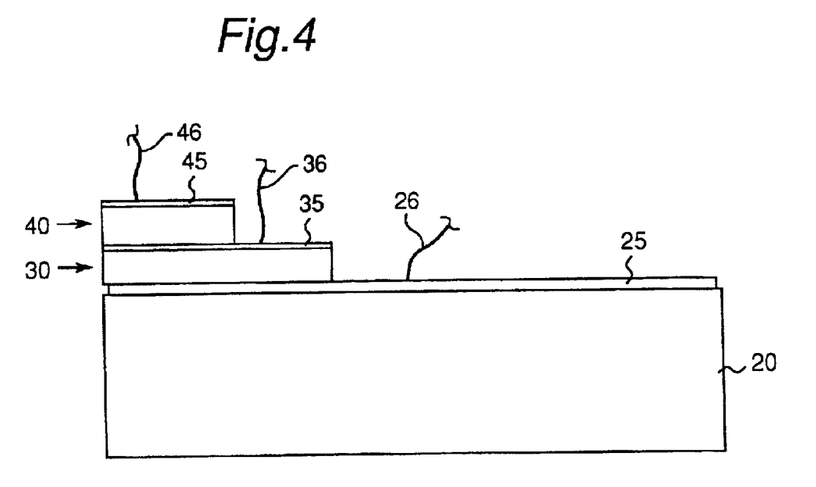
FIG. 4 is a side view of the semiconductor laser device of FIG. 3.

A thick insulative submount 20 is disposed on an upper surface of the supporting portion 12 of the stem. The submount 20 has an electrode layer 25 on a top thereof, as shown in FIGS. 3 and 4. The first and second laser chips (semiconductor laser elements) 30, 40 are disposed on the electrode layer 25 in this order. FIG. 3 is an enlarged front view showing the submount 20 and the first and second laser chips 30, 40. FIG. 4 is a side view showing the submount 20 and the first and second laser chips 30, 40.

The first laser chip 30 having an electrode layer 35 at its top is disposed on the electrode layer 25 formed at the top of the submount 20. The second laser chip 40 is disposed on the first laser chip 30 through the electrode layer 35, which functions as a common electrode for the first and second chips. An electrode layer 45 is formed on the second laser chip 40. Each of the first and second laser chips 30, 40, which are known per se, amplifies light in an active layer formed between a P-layer and an N-layer thereof to emit the light as laser beams. FIG. 3 shows emission points 31, 41 of the first and second laser chips 30, 40.

Referring back to FIG. 2, laser terminals 13, 14 having welding plates 13a, 14a at front ends thereof respectively project from the front surface of the stem main body 11 like arms. The terminals 13, 14 are insulated from the stem with glass or other appropriate insulating materials. A metal wire 26 electrically connects the electrode layer 25 and the welding plate 14a (terminal 14) to each other. A metal wire 46 electrically connects the second laser chip 40 and the welding plate 13a (terminal 13) to each other. A metal wire 36 electrically connects the electrode layer 35 located between the first and second laser chips 30, 40 and the stem supporting portion 12 to each other. Because the stem supporting portion 12 is conductive to the stem main body 11, the metal wire 36 and the supporting portion 12 of the stem electrically connect the electrode layer 35 between the chips and the stem main body 11 to each other.

As apparent from FIGS. 2 and 4, the first laser chip 30 having a larger size than the second laser chip 40 extends on the electrode layer 25. Thus, part of the first laser chip 30 is exposed. Therefore, it is easy to perform an operation of welding the metal wire 36 to the common electrode 35 located between the two chips.

The first laser chip 30 having a higher temperature dependence is mounted on the submount 20, and the second laser chip 40 having a lower temperature dependence is disposed on the first laser chip 30. In other words, the laser chip disposed farther from the mounting surface of the stem has a lower temperature dependence.

Heat generated by each laser chip is released toward the stem 11 through the submount 20. Thus, the heat generated by the first laser chip 30 is easy to dissipate because the first laser chip 30 is near to the mounting surface of the stem (more precisely, of the supporting portion 12), whereas the heat generated by the second laser chip 40 is hard to dissipate because the second laser chip 40 is farther from the mounting surface of the stem. Therefore, it is preferred that the second laser chip 40 is less susceptible to temperature, i.e., has a lower temperature dependence than the first laser chip 30.

In the present invention, for the accommodation to different kinds of optical disks such as the CD, the CD-R, and the DVD, the emission wavelength of one of the laser chips is set to be within a range of 640–660 nm, whereas the emission wavelength of the other laser chip is set to be within a range of 770–800 nm. The temperature dependence of laser chips having wavelengths in those ranges will be discussed below with reference to FIGS. 5 and 6.

Figure 5:
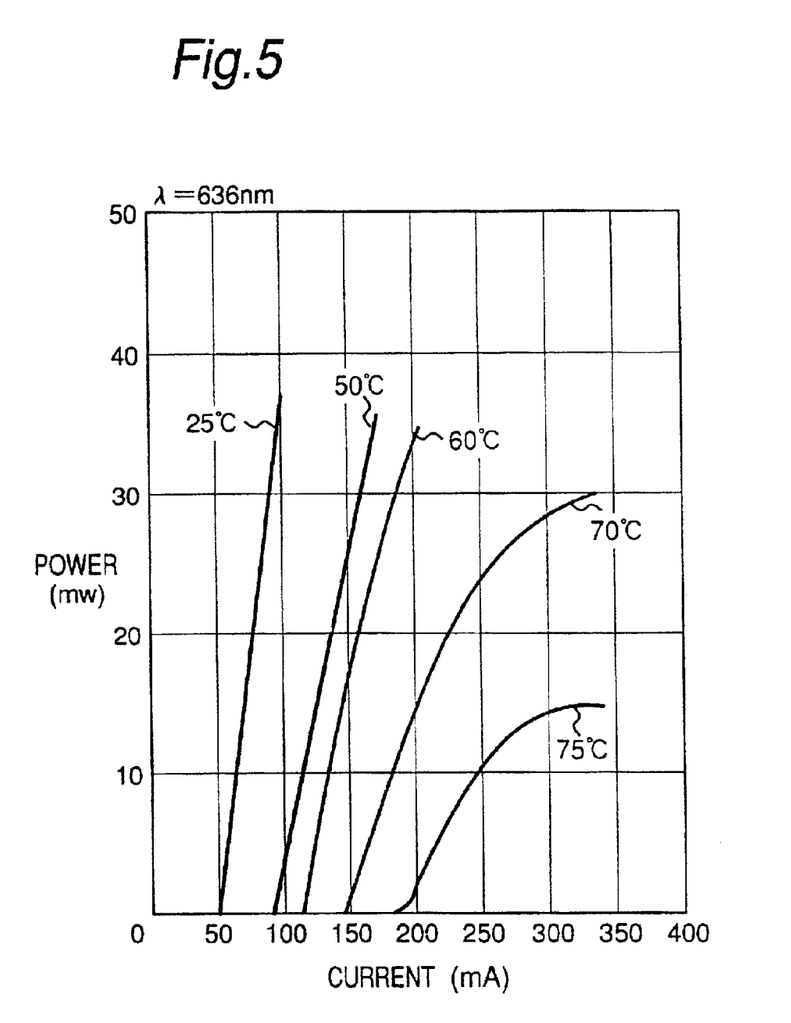
FIG. 5 is a graph showing the temperature dependence of a laser chip emitting red light.
Figure 6:
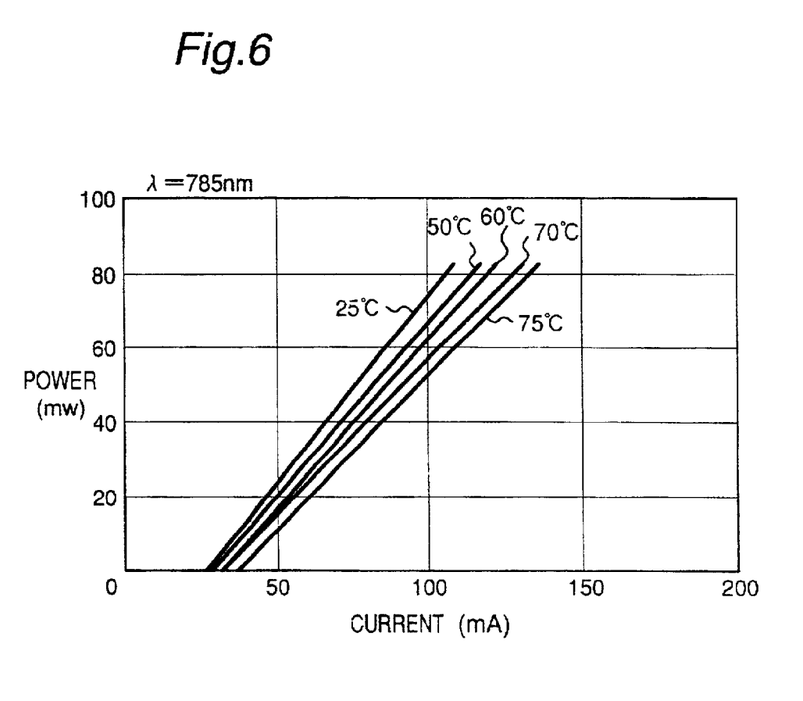
FIG. 6 is a graph showing the temperature dependence of a laser chip emitting infrared light.

FIG. 5 is a graph showing the relationship between electric current and power (cutput) of a laser chip that emits red light of a wavelength of 636 nm, with the temperature used as a parameter. Similarly, FIG. 6 is a graph showing the relationship between electric current and power (output) of a laser chip that emits infrared light of a wavelength of 785 nm, with the temperature user as a parameter. Comparison of both graphs reveals that the laser chip emitting the infrared light has a lower temperature dependence than the laser chip emitting the red light.

Accordingly, in the embodiment, the laser chip emitting red light having a wavelength in the range of 640–660 nm is disposed at the lower side as the first laser chip 30, whereas the laser chip emitting infrared light having a wavelength in the range of 770–800 nm is disposed at the upper side as the second laser chip 40. Other combinations of two laser chips having different emission wavelengths and different temperature dependences include a combination of a red laser chip and a blue laser chip and a combination of an infrared laser chip and a blue laser chip. The blue laser chip has a temperature dependence highest of these three kinds of laser chips.

Figure 7A:
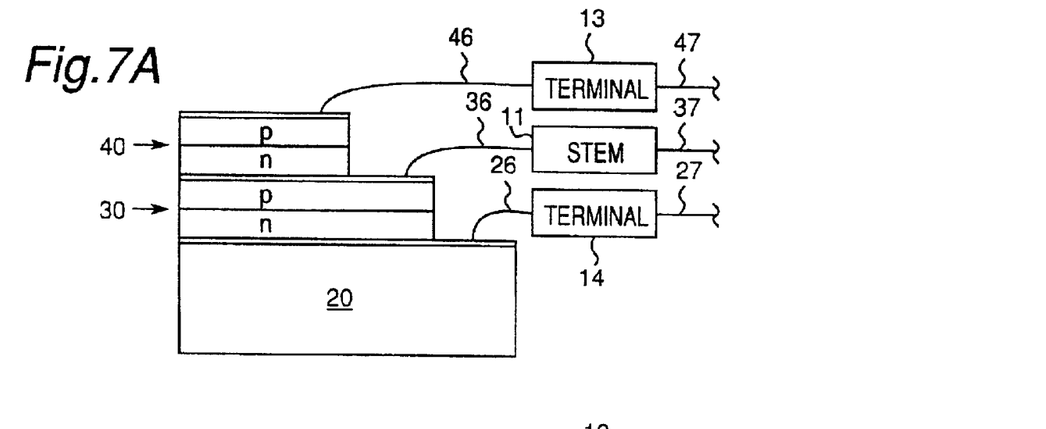
FIGS. 7A, 7B, and 7C are side views showing a variation of disposition or placement of each laser chip of the semiconductor laser device shown in FIG. 2.
Figure 7B:
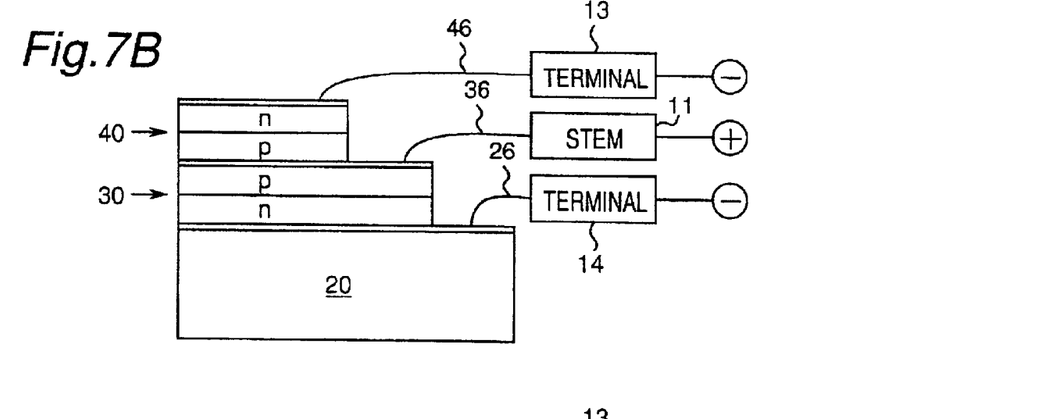
Figure 7C:
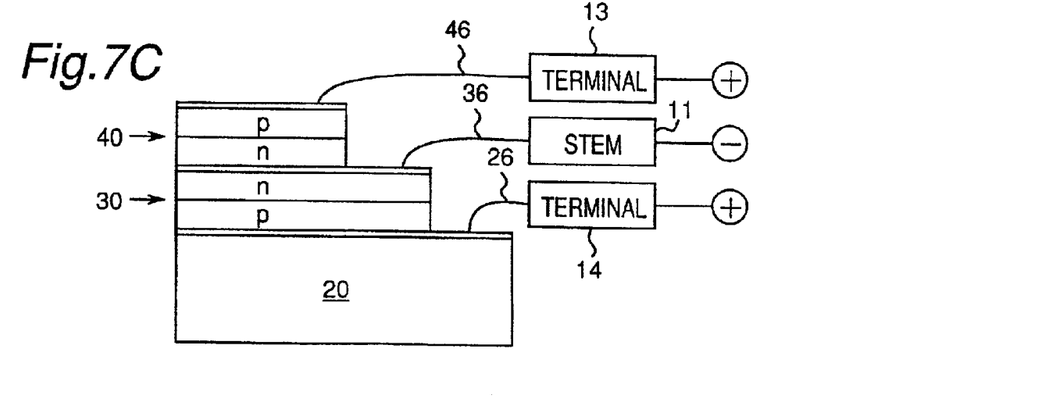

FIGS. 7A–7C schematically show electrical wiring or electrical connection in the semiconductor laser device 10. P-layers and N-layers of the laser chips are arranged in different ways in Figs. FIGS. 7A, 7B, and 7C. A lead 37 is welded to the stem main body 11 and leads 47, 27 are welded to the terminals 13, 14 insulated from the stem main body 11. These leads 37, 47, 27 extend from the rear side of the stem main body 11 and are electrically connected to an unshown control circuit. As is apparent from FIGS. 7A–7C, by controlling potential differences among the leads 37, 47, and 27, laser beams can be selectively emitted from either the laser chip 30 or the laser chip 40.

In the case where the P-layer of one laser chip and the N-layer of the other laser chip are adjacent to each other, as shown in FIG. 7A, the lead 37 becomes an anode or a cathode, depending on which of the laser chips is turned on to emit light. On the other hand, in the case where the P-layer of one laser chip is adjacent to the P-layer of the other laser chip, as shown in FIG. 7B, or where the N-layer of one laser chip is adjacent to the N-layer of the other laser chip, as shown in FIG. 7C, the terminal polarity of the lead 37 can be so-called anode-common or cathode-common. That is, the lead 37 is commonly used as an anode in the case of FIG. 7B and as a cathode in the case of FIG. 7C for both laser chips. The constructions shown in FIGS. 7B and 7C allow the driving circuit to be simplified and are thus more advantageous than that shown in FIG. 7A.

In manufacturing the semiconductor laser device, joining operations are required at three portions: joining between the supporting portion 12 and the submount 20, joining between the submount 20 and the first laser chip 30, and joining between the first laser chip 30 and the second laser chip 40. Those three portions can be joined in any possible order. For example, joining between the supporting portion 12 and the submount 20 may be performed first and joining between the first laser chip 30 and the second laser chip 40 may be performed last, or the reverse. In the case where joining is achieved by soldering, it is preferable to use three kinds of soldering materials having different melting points for the three joined portions. In this case, a soldering material having a highest melting point is used in an initial joining operation. Thereafter, soldering materials having decreasing melting points are used. In this way, it is possible to prevent occurrence of a disadvantage that the soldering material at a portion previously soldered melts in a later joining operation. An example of the combination of the three kinds of soldering materials having different melting points includes a combination of "gold-silicon alloy", "gold-tin alloy", and "lead-tin alloy" in the order of decreasing melting points. As another example, a combination of "gold-tin alloy", "lead-tin alloy", and "indium (or silver paste)" may be used. Although it is preferable to use soldering materials having different melting points, as described above, it is possible to use the same soldering material for all joined portions. It is also possible to use a conductive resin in performing a joining operation.

Figure 8:
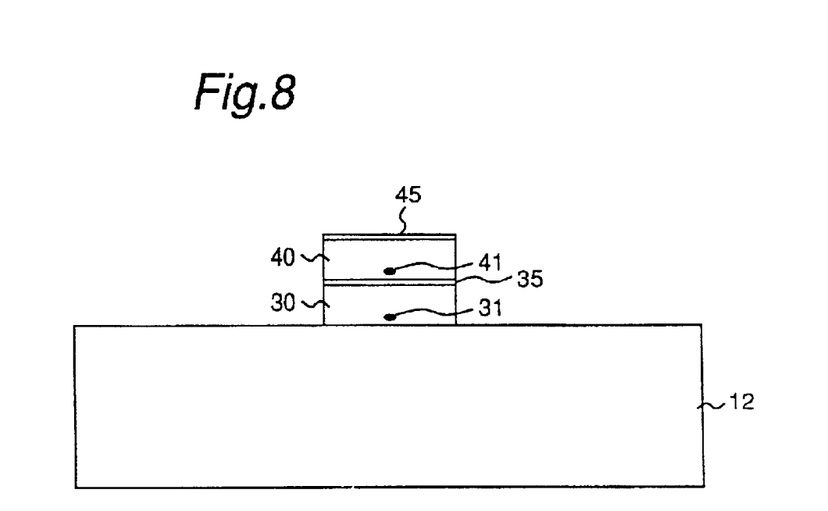
FIG. 8 is an enlarged front view of the semiconductor laser device of the invention, showing two laser chips mounted directly onto the stem.
Figure 9:
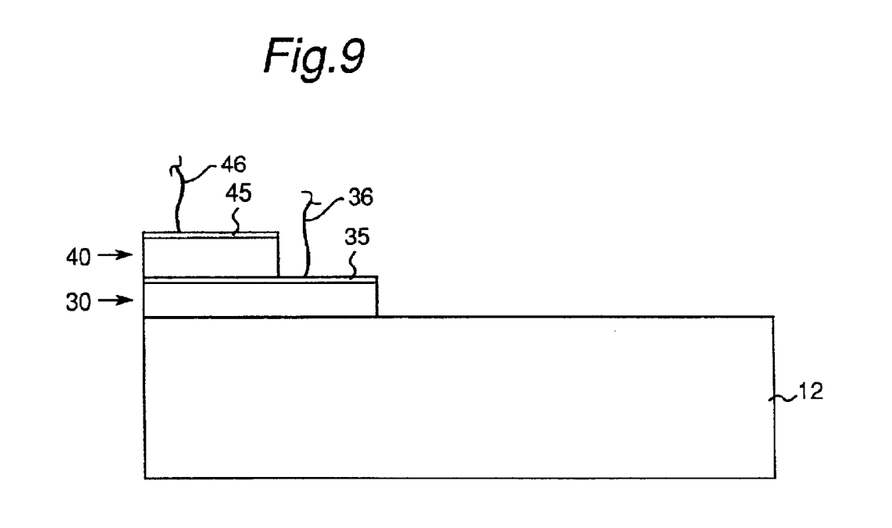
FIG. 9 is a side view of the semiconductor laser device of FIG. 8.

In the example shown in FIGS. 2–4, because the common electrode layer 35 formed between both laser chips is electrically connected to the stem through the lead 36, the insulating submount 20 is provided under the first laser chip 30. But in the case where the common electrode 35 is electrically connected to the terminal 14 through the lead 36, the first laser chip 30 is mounted directly onto the stem (more specifically, onto the supporting portion of the stem) without interposition of the insulating submount 20, as shown in FIGS. 8 and 9. In this case, the electrode 25 is unnecessary. Also, needless to say, it is unnecessary to perform a joining operation for the submount 20.

Because the second laser chip 40 is disposed on top of the first laser chip 30, the emission points 31 and 41 of the first and second laser chips 30 and 40 are spaced from each other vertically to the optical axis of the collimator lens. Therefore, in order to obtain preferable collimated light by making light from each emission point incident on a single collimator lens, it is preferable that the interval between both emission points is as short as possible. Ideally, the interval should be 160 micrometers or less.

To achieve the interval of 160 micrometers or less, it is conceivable to set the height of each of the laser chips 30, 40 to 80 micrometers or less. In this case, the total of the heights of both laser chips is 160 micrometers or less. Thus, even when the positions of the emission points 31, 41 are not located at the center of the height of each laser chip as shown in FIG. 3, the interval between both emission points is necessarily 160 micrometers or less. In the case where the emission point of each laser chip is formed just at the center of its height, the height of each chip should be 160 micrometers or less.

In the embodiment of the present invention, two laser chips are disposed one on top of the other. But needless to say, three or more laser chips can be laid one on top of another. Then, it is possible to perform reading and writing for a number of optical disks corresponding to the number of the laser chips mounted. In such a case also, the laser chips should be located such that a laser chip having a lower temperature dependence is farther from the stem.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:

a stem having a mounting surface;

a first semiconductor laser element mounted on the mounting surface of said stem, said first semiconductor laser element having an emission wavelength and a temperature dependence; and a second semiconductor laser element disposed on top of said first semiconductor laser element, said second semiconductor laser element having an emission wavelength different from the emission wavelength of said first semiconductor laser element and a temperature dependence lower than the temperature dependence of said first semiconductor laser element.

2. The semiconductor laser device according to claim 1, wherein the emission wavelength of said first semiconductor laser element is within a wavelength range of 640–660 nm, while the emission wavelength of said second semiconductor laser element is within a wavelength range of 770–800 nm.

3. The semiconductor laser device according to claim 1, wherein said second semiconductor laser element provided on top of the first semiconductor laser element is smaller in size than said first semiconductor laser element such that a part of a top surface of said first semiconductor laser element is exposed.

4. The semiconductor laser device according to claim 1, wherein each of said first and second semiconductor laser elements has an N-layer and a P-layer, and either the N-layers or the P-layers of said first and second semiconductor laser elements are adjacent to each other.

5. The semiconductor laser device according to claim 1, wherein each of said first and second semiconductor laser elements has an emission point and the emission points of said first and second semiconductor laser elements are located at an interval of 160 micrometers or less.

6. The semiconductor laser device according to claim 1, wherein there are a plurality of joined portions in which different soldering materials having different melting points are used.

7. A semiconductor laser device comprising:

a stem having a mounting surface; and a plurality of semiconductor laser elements disposed one on top of another and over the mounting surface of the stem so as to be supported by the stem, said plurality of semiconductor laser elements having different emission wavelengths and different temperature dependencies;

wherein said plurality of semiconductor laser elements are stacked in order of temperature dependence such that the laser chip farther from the mounting surface of the stem has a lower temperature dependence than the laser chip closer to the mounting surface of the stem.

8. The laser device of claim 1, wherein the second laser element emits a higher wavelength than does the first laser element that is closer to the mounting surface of the stem.

9. The laser device of claim 7, wherein the laser chip farther from the mounting surface emits a higher wavelength than does the laser chip closer to the mounting surface of the stem.

10. A semiconductor laser device comprising:

a first semiconductor laser element supported by a mount, said first semiconductor laser element having an emission wavelength and a temperature dependence; and a second semiconductor laser element disposed at least partially over said first semiconductor laser element, said second semiconductor laser element having an emission wavelength higher than the emission wavelength of said first semiconductor laser element and a temperature dependence lower than the temperature dependence of said first semiconductor laser element so that power of the second semiconductor laser element is less affected by a given change in temperature than power of the first semiconductor laser element which is closer to the mount.

11. A semiconductor laser device comprising:

a stem including a mounting surface;

a first semiconductor laser element mounted on the mounting surface of said stem, said first semiconductor laser element having an emission wavelength in a range of 640–660 nm; and a second semiconductor laser element disposed on top of said first semiconductor laser element and having an emission wavelength in a range of 770–800 nm.

12. The semiconductor laser device of claim 11, wherein said second semiconductor laser element has a temperature dependence lower than a temperature dependence of said first semiconductor laser element so that power of the second semiconductor laser element is less affected by a given change in temperature than power of the first semiconductor laser element which is closer to the stem.

13. The semiconductor laser device of claim 11, wherein the first semiconductor laser element is directly mounted on the mounting surface of said stem.

14. The semiconductor laser device of claim 1, wherein the first semiconductor laser element is directly mounted on the mounting surface of said stem.

* * * * *